United States Patent
Giorgini et al.

(10) Patent No.: US 9,659,832 B2
(45) Date of Patent: May 23, 2017

(54) REACTIVE HOT-MELT ADHESIVE FOR USE ON ELECTRONICS

(75) Inventors: Albert M. Giorgini, Lino Lakes, MN (US); Andrew Hilley, Stirlingshire (GB)

(73) Assignee: H.B. Fuller Company, St. Paul, MN (US)

( * ) Notice: Subject to any disclaimer, the term of this patent is extended or adjusted under 35 U.S.C. 154(b) by 300 days.

(21) Appl. No.: 14/233,962

(22) PCT Filed: Jul. 19, 2012

(86) PCT No.: PCT/US2012/047383
§ 371 (c)(1),
(2), (4) Date: Apr. 9, 2014

(87) PCT Pub. No.: WO2013/016130
PCT Pub. Date: Jan. 31, 2013

(65) Prior Publication Data
US 2014/0242323 A1   Aug. 28, 2014

Related U.S. Application Data

(60) Provisional application No. 61/510,784, filed on Jul. 22, 2011.

(51) Int. Cl.
*H01L 21/02* (2006.01)
*H01L 23/29* (2006.01)
(Continued)

(52) U.S. Cl.
CPC ............ *H01L 23/293* (2013.01); *C08G 18/10* (2013.01); *C09J 5/00* (2013.01); *C09J 175/04* (2013.01);
(Continued)

(58) Field of Classification Search
CPC .. C08G 18/10; C08G 18/307; C08G 2170/20; C09J 175/04; C09J 2203/318; C09J 2203/322; C09J 2203/326; C09J 2423/00; C09J 2475/00; C09J 5/00; Y10T 428/239; Y10T 428/31551; Y10T 428/31565; Y10T 428/31587; H01L 2924/00; H01L 2924/00014; H01L 2924/07802; H01L 2924/1204; H01L 2224/27003;
(Continued)

(56) References Cited

U.S. PATENT DOCUMENTS 5,332,786 A * 7/1994 Nagata ................... C08G 18/10
525/130
5,578,142 A * 11/1996 Hattori ................... H01L 31/048
136/251
(Continued)

FOREIGN PATENT DOCUMENTS

CA    2347818 A1    5/2000
JP    H05270173 A    10/1993

*Primary Examiner* — Thao T Tran
(74) *Attorney, Agent, or Firm* — Kirsten Stone; Allison Johnson

(57) ABSTRACT

The disclosure relates to a method of making an electronic assembly with a reactive hot-melt adhesive composition that include an atmospheric curing prepolymer and optionally a thermoplastic component with a softening point of at least about 120° C., and the electronic assembly made therewith.

16 Claims, 2 Drawing Sheets

(51) Int. Cl.

| | |
|---|---|
| *C08G 18/10* | (2006.01) |
| *C09J 5/00* | (2006.01) |
| *C09J 175/04* | (2006.01) |
| *H01L 23/10* | (2006.01) |
| *H01L 23/31* | (2006.01) |
| *H01L 21/50* | (2006.01) |
| *H01L 23/00* | (2006.01) |
| *H01L 21/56* | (2006.01) |

(52) U.S. Cl.
CPC .............. *H01L 21/02* (2013.01); *H01L 21/50* (2013.01); *H01L 21/563* (2013.01); *H01L 23/10* (2013.01); *H01L 23/3121* (2013.01); *H01L 24/29* (2013.01); *H01L 24/83* (2013.01); *C08G 2170/20* (2013.01); *C09J 2203/318* (2013.01); *C09J 2203/322* (2013.01); *C09J 2203/326* (2013.01); *C09J 2423/00* (2013.01); *C09J 2475/00* (2013.01); *H01L 23/564* (2013.01); *H01L 2224/27003* (2013.01); *H01L 2224/2731* (2013.01); *H01L 2224/2741* (2013.01); *H01L 2224/27312* (2013.01); *H01L 2224/27318* (2013.01); *H01L 2224/27418* (2013.01); *H01L 2224/27422* (2013.01); *H01L 2224/2919* (2013.01); *H01L 2224/2929* (2013.01); *H01L 2224/29386* (2013.01); *H01L 2224/83877* (2013.01); *H01L 2924/07802* (2013.01); *H01L 2924/12041* (2013.01); *H01L 2933/005* (2013.01); *Y10T 428/239* (2015.01)

(58) Field of Classification Search
CPC . H01L 2224/27312; H01L 2224/27318; H01L 2224/27418; H01L 2224/27422; H01L 2224/2731; H01L 2224/2741; H01L 2224/2919; H01L 2224/2929; H01L 2224/29386
USPC .............. 428/76, 423.7, 424.8; 156/327, 329
See application file for complete search history.

(56) References Cited

U.S. PATENT DOCUMENTS

| | | | | |
|---|---|---|---|---|
| 5,776,406 | A * | 7/1998 | Schubert | B29C 45/0001 264/328.1 |
| 6,172,295 | B1 * | 1/2001 | Hattori et al. | 136/251 |
| 6,649,014 | B1 * | 11/2003 | Wada | 156/286 |
| 2006/0084755 | A1 * | 4/2006 | Good et al. | 524/589 |
| 2008/0241529 | A1 * | 10/2008 | Bauer et al. | 428/355 R |
| 2011/0214715 | A1 * | 9/2011 | Kahles et al. | 136/251 |
| 2012/0142885 | A1 * | 6/2012 | Matsuki | C08G 18/10 528/83 |
| 2014/0242322 | A1 * | 8/2014 | Giorgini | 428/76 |

* cited by examiner

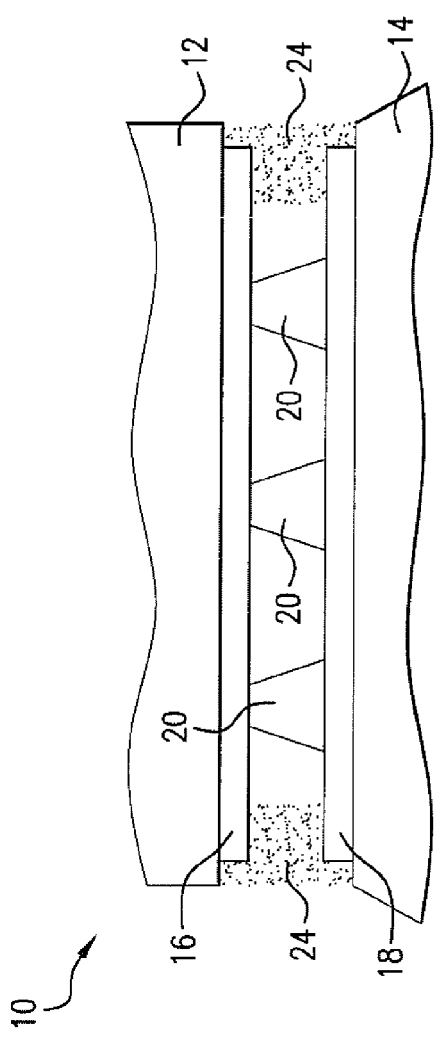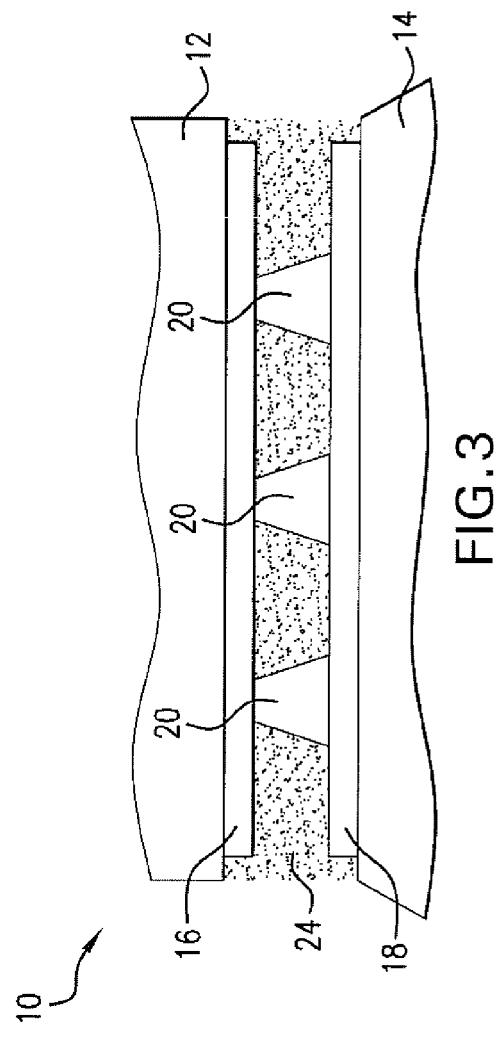

REACTIVE HOT-MELT ADHESIVE FOR USE ON ELECTRONICS

This application claims the benefit of U.S. Provisional Application No. 61/510,784, filed Jul. 22, 2011, which is incorporated herein.

SUMMARY OF THE INVENTION

In some aspects, the present disclosure relates to a method of making an electronic assembly comprising a first substrate, a second substrate, and an electronic component located between the two substrates. The method includes providing a reactive hot melt adhesive composition that cures in the presence of moisture and contains an atmospheric curing prepolymer. The adhesive is applied to at least a portion of the first substrate. Then at least a portion of a second substrate is brought into contact with the adhesive on the first substrate. Either the first or the second substrate includes an electronic component prior to applying the adhesive.

In one embodiment, the adhesive further includes a thermoplastic component with a Mettler softening point of at least 120° C.

In some aspects, the present disclosure relates to an electronic assembly that includes a first substrate, a second substrate, an electronic component located between the first and second substrates, and a reactive hot melt adhesive including a reaction product of an atmospheric curing prepolymer and moisture. At least a portion of the first substrate is bonded to at least a portion of the second substrate by the adhesive.

In one embodiment, the adhesive further includes a thermoplastic component with a Mettler softening point of at least 120° C.

BRIEF DESCRIPTION OF THE DRAWINGS

FIG. 2 shows a cross-sectional view of an electronic component between two substrates with adhesive around the edges of the assembly.

FIG. 3 shows a cross-sectional view of an electronic component between two substrates with adhesive throughout the assembly.

DETAILED DESCRIPTION OF THE INVENTION

Adhesive Composition

Figure 1:
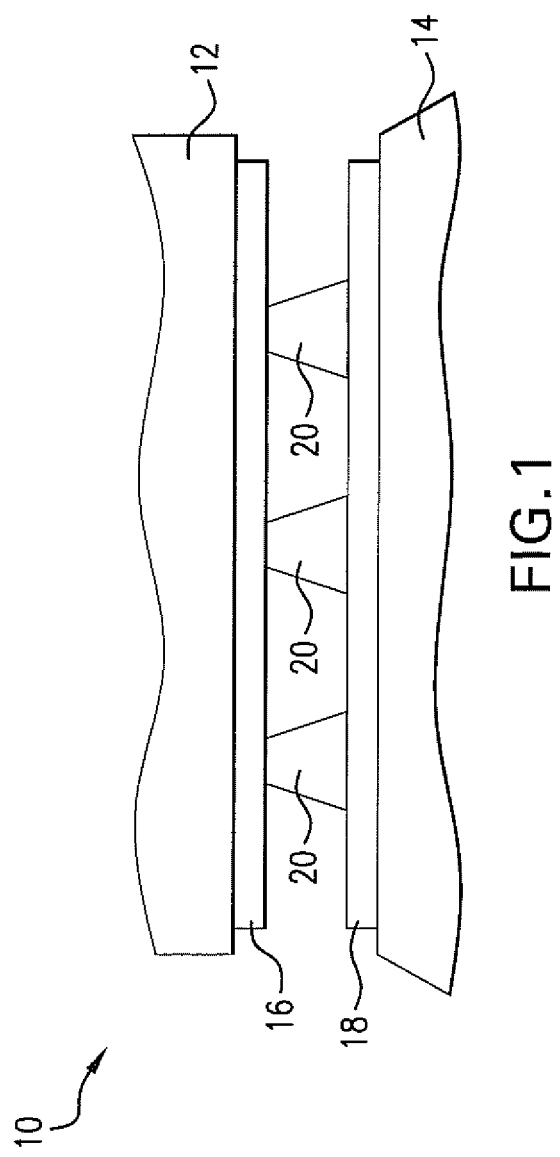
FIG. 1 shows a cross-sectional view of an electronic component between two substrates.

The disclosed adhesive composition is a reactive hot-melt adhesive that includes an atmospheric curing prepolymer, and optionally a thermoplastic component with a Mettler softening point of at least 120° C. The thermoplastic component can be selected from the group consisting of thermoplastic elastomers, thermoplastic polymers, and combinations thereof. The adhesive cures upon exposure to atmospheric moisture.

Before curing, the adhesive exhibits a melt viscosity of from about 5,000 centipoises (cps) to about 500,000 cps, or even from about 10,000 cps to about 400,000 cps, at a temperature of from about 100° C. to about 150° C.

The adhesive preferably exhibits an initial lap shear strength of at least about 2 pound per square inch (psi), or even at least 4 psi, at 60° C. Preferably the adhesive exhibits a final lap shear strength of at least about 20 psi, or about 30 psi, or about 70 psi, or even about 100 psi, when tested according to herein described Lap Shear Strength Test Method after 12 weeks at 23° C. and 50% relative humidity.

The adhesive is capable of providing a vapor barrier. Preferably the adhesive exhibits a moisture vapor transmission rate (MVTR) of no greater than 20 g/m$^2$/day, or even no greater than 10 g/m$^2$/day, when in the form of a 60 mil film.

The adhesive also preferably exhibits less than 50% adhesion failure, less than 10% adhesion failure, or even less than 5% adhesion failure to polyethylene terephthalate (PET) film, when tested according to herein described Peel Adhesion Test Method.

When used with electronics assemblies, the adhesive preferably exhibits certain properties. For example, the adhesive is preferably capable of being processed at low temperatures on low cost substrates. It is preferably capable of being used in an automated roll-to-roll manufacturing process. It preferably exhibits a fast attach without requiring a B-stage or partial cure. The composition preferably has a long open or long set time. The composition preferably exhibits good initial strength and final bond strength to low energy materials like plastics. It is preferably flexible. It preferably exhibits good moisture and oxygen barrier performance. It is preferably optically clear and does not yellow when exposed to UV radiation or higher temperatures. It preferably exhibits low outgassing and voids. And it preferably acts as a drying agent or desiccant by consuming residual moisture inside of the sealed assembly.

Atmospheric Curing (Moisture Curing) Prepolymer

The adhesive includes an atmospheric curing prepolymer. The atmospheric curing prepolymer is a prepolymer that cures upon exposure to moisture, e.g., atmospheric moisture. Useful atmospheric curing prepolymers include, e.g., isocyanate-terminated polyurethane prepolymers (e.g., polyether urethanes and polyester urethanes); silanated terminated polyurethane prepolymers, polydimethylsiloxanes, alkoxy-, acetoxy-, and oxyamino-silane terminated polyethers; silane-functional poly-α-olefin polymer; alkyl siloxane polymers crosslinked with alkoxy-, acetoxy-, and oxyamino-organo functional silanes; and combinations thereof.

The adhesive composition preferably includes the atmospheric curing prepolymer in an amount of from about 5% by weight, or about 10% by weight, or about 15% by weight, or about 20% by weight to about 100% by weight, or to about 95% by weight, or to about 85% by weight, or to about 70% by weight, or to about 50% by weight, based on the weight of the composition.

Isocyanate-Terminated Polyurethane Prepolymers.

In the embodiments where the atmospheric curing prepolymer is an isocyanate-terminated polyurethane prepolymer, a variety of isocyanate-terminated prepolymers can be included in the adhesive composition.

Useful isocyanate-terminated polyurethane prepolymers include the reaction product of a polyisocyanate having an isocyanate functionality of at least 2 and a polyol (e.g., a polyester polyol, a polyether polyol, or combinations thereof).

Preferred isocyanate-terminated polyurethane prepolymers include those that are a reaction product of an aliphatic polyisocyanate and a polyol.

Useful polyisocyanate include, e.g., aromatic isocyanates, aliphatic isocyanates, cycloaliphatic isocyanates, and combinations thereof. Useful aromatic isocyanates include, e.g., diphenyl methylene diisocyanate, 2,2'-diphenyl methylene diisocyanate, 4,4'-diphenyl dimethylmethylene diisocyanate, diphenyl methylene 2,4'-diisocyanate, tetramethyl xylene diisocyanate, toluene diisocyanate, naphthalene diisocyanate (e.g., naphthalene 1,5-diisocyanate), di- and tetraalkyl diphenylmethane diisocyanate, 4,4-dibenzyl diisocyanate, 1,3-phenylene diisocyanate, 1,4-phenylene diisocyanate, and combinations thereof.

Useful aliphatic polyisocyanates include, e.g., 1,3-cyclopentane diisocyanate, 1,4-cyclohexane diisocyanate, 1,3-cyclohexane diisocyanate, hydrogenated MDI (i.e., dicyclohexylmethane diisocyanate, $H_{12}$-MDI), methyl 2,4-cyclohexanediisocyanate, methyl 2,6-cyclohexanediisocyanate, 1,4-bis(isocyanatomethyl)cyclohexane, 1,3-bis(isocyanatomethyl)cyclohexane.

Other suitable aliphatic diisocyanates include, e.g. hexamethylene diisocyanate, hydrogenated MDI, dodecane isocyanate, dimer diisocyanate, tetramethoxybutane 1,4-diisocyanate, butane 1,4-diisocyanate, hexane 1,6-diisocyanate (HDI), 1,6-diisocyanato-2,2,4-trimethylhexane, 1,6-diisocyanato-2,4,4-trimethylhexane, 1,12-dodecane diisocyanate ($C_{12}$DI), polymeric isocyanates, trimeric isocyanates, and combinations thereof.

Suitable cycloaliphatic polyisocyanates include, e.g., the hydrogenation products of the aforementioned aromatic diisocyanates including, e.g., 4,4'-dicyclo-hexylmethane diisocyanate ($H_{12}$MDI), 1-isocyanatomethyl-3-isocyanato-1,5,5-trimethylcyclohexane (isophorene diisocyanate, IPDI), cyclohexane 1,4-diisocyanate, hydrogenated xylylene diisocyanate ($H_6$XDI), 1-methyl-2,4-diisocyanatocyclohexane, m- and p-tetramethylxylene diisocyanate (m-TMXDI, p-TMXDI), dimer fatty acid diisocyanate, and combinations thereof.

Preferably the isocyanate and the polyol are combined at an NCO:OH ratio of from about 4.0:1.0 to about 4.0:1.5 to obtain an % NCO in the polyisocyanate prepolymer of from about 0.1% by weight to about 10% by weight. One useful method of determining residual NCO concentration is ASTM D-2572-80 "Standard Method for Isocyanate Group and Urethane Materials or Prepolymers."

Useful isocyanates are also disclosed, e.g., in U.S. Pat. No. 4,775,719; U.S. Pat. No. 4,808,255; and U.S. Pat. No. 4,820,368; all of which are incorporated herein. One example of a useful commercially available polyisocyanate is ISONATE 125M pure diphenylmethane diisocyanate (MDI) from Dow Chemical Co. (Midland, Mich.). Particularly preferred diisocyanates are aliphatic isocyanate or blends of aliphatic isocyanates as they provide excellent UV stability (non-yellowing) and hydrolytic stability.

Useful commercially available aliphatic isocyanates include, e.g., DESMODUR W, DESMODUR I, and DESMODUR N 3600, all from Bayer (Pittsburgh, Pa.) and VESTANAT IPDI and VESTANAT H12MDI from Evonik Degussa (Parsippany, N.J.).

Suitable polyols for forming the prepolymer include polyhydroxy compounds having at least two hydroxyl groups per molecule, and a number average molecular weight of from about 400 to about 20,000, or even from about 1000 to about 6000. Useful polyols include polyols that are glass-like (i.e., amorphous), solid, crystalline, or liquid at room temperature. Useful polyols include, e.g., polyester polyols, polyether polyols, polyalkylene polyols, and mixtures thereof. Suitable polyester polyols include those polyester polyols described in U.S. Pat. No. 4,808,255, which is incorporated herein. Useful polyester polyols include those polyether polyols described in U.S. Pat. No. 5,441,808, which is incorporated herein. Useful polyalkylene polyols include those polyalkylene polyols described in U.S. Pat. No. 4,820,368, which is incorporated herein. Useful polyols are also described in Doyle, E. N., The Development and Use of Polyurethane Products, McGraw-Hill Book Co., 1971, pages 44-62.

The polyol is preferably formed from a diacid and a diol. Suitable diacids have greater than about 10 carbon atoms. Some useful polyester polyols include the reaction product of a dimer acid (e.g. EMPOL 1061 and EMPOL 1018 dimer acids available from the Cognis Chemical (Cincinnati, Ohio)) and at least one of neopentyl glycol, ethylene glycol, propylene glycol, cyclohexanel, 4-butanediol, and 1,6-hexanediol.

One useful class of polyether polyols includes polyoxyalkylene polyols in which the alkylene is $C_{2-8}$. Other useful polyoxyalkylene polyols include, e.g., and polytetramethylene ether glycols (e.g., polytetramethylene glycols having a number average molecular weight of from about 600 and about 6000, or even from about 800 to about 5000), poly(alkylenoxide)glycols wherein alkylene is $C_{2-8}$ including poly(1,2- and 1,3-propylene oxide)glycol, poly(tetramethylene oxide)glycol, poly(pentamethylene oxide)glycol, poly(hexamethylene oxide)glycol, poly(heptamethylene oxide)glycol, poly(octamethylene oxide)glycol, poly(nonamethylene oxide)glycol, and poly(1,2-butylene oxide) glycol, difunctional polypropylene glycols, trifunctional polypropylene glycols, random and block copolymers of ethylene oxide and 1,2-propylene oxide (used in proportions such that the carbon to oxygen mole ratio in the glycol is greater than 2.5), and poly-formals prepared by reacting formaldehyde with glycols (e.g., pentamethylene glycol), or mixtures of glycols (e.g., a mixture of tetramethylene glycol and pentamethylene glycol). Additionally, the dicarboxymethyl acids of polyoxyalkylene polyols can be used to form long chain polyols in situ. The polyol used to form the polyisocyanate prepolymer can be the same polyol used in the preparation of the polyether polyester block copolymer.

Useful polyester polyols include those that are the reaction product of various polyols (e.g., dials and triols) with aromatic acids, aliphatic dicarboxylic acids, tricarboxylic acids, polymers of lactones (e.g., ε-caprolactone) (e.g., polycaprolactone), and combinations thereof. Polyols suitable for forming the polyester polyol include, e.g. ethylene glycol, butane diol (e.g. 1,4-butanediol), neopentyl glycol, hexane diol, propylene glycol, dipropylene glycol, diethylene glycol, triethylene glycol, cyclohexane dimethanol, 1,6-hexanediol, 1,8-octanediol, 1,10-decandiol, 1,12-dodecandiol, dimeric fatty alcohol, glycerol, trimethylolpropane, and combinations thereof. Suitable aromatic acids for forming the polyester polyol include, e.g., teraphthalic acid, isophthalic acid, hexahydrophthalic acid, phthalic anhydride, and combinations thereof. Suitable aliphatic acids for forming the polyester polyol include e.g., sebasic acid, adipic acid, glutaric acid, azelaic acid, succinic acid, suberic acid, undecanedioic acid, dodecanedioic acid, 3,3-dimethylglutaric acid, dimeric fatty acids, and combinations thereof.

Other useful polyester polyols include, e.g., polyols derived from oleochemicals, and the complete ring opening of epoxidized triglycerides of an at least partially olefinically unsaturated fatty acid-containing fat mixture and at least one alcohol containing from 1 carbon atom to 12 carbon atoms, followed by partial transesterification of the triglyceride derivatives to form alkyl ester polyols having from 1 carbon atom to 12 carbon atoms in the alkyl radical. Further suitable polyols include polycarbonate polyols, dimeric diols, castor oil and its derivatives, and hydroxyfunctional polybutadienes.

Also suitable as polyols are linear and slightly branched acrylic ester copolymer polyols, which may be produced according to a number of methods including, e.g., by free-radical copolymerization of at least one of acrylic acid ester and a methacrylic acid ester, and at least one of a hydroxy-functional acrylic acid compound and a methacrylic acid compound (e.g., hydroxyethyl (meth)acrylate and hydroxypropyl (meth)acrylate).

When mixtures of polyols are used in the preparation of the isocyanate-terminated prepolymer, the polyols preferably have at least partial compatibility with the polyether polyester block copolymer when it is used as the thermoplastic polymer.

The isocyanate-terminated prepolymer may be stripped to less than 0.5% free isocyanate monomer. One device useful for stripping unreacted isocyanate monomer is a wipe film evaporator. The use of stripped isocyanate-terminated prepolymer can result in improved safety in handling the adhesives.

Silanated-Terminated Polyurethane Prepolymer.

The atmospheric curing or moisture curing prepolymer can also be a moisture curable silanated-terminated polyurethane prepolymer. Any hydrogen active organofunctional silane that includes at least one functional group (e.g., hydrogen) that is reactive with an isocyanate group of a polyurethane prepolymer, and has at least one silyl group can be used to prepare the prepolymer. Examples of useful silyl groups include alkoxysilyls, aryloxysilyls, alkyloxy-iminosilyls, oxime silyls, and amino silyls. Preferred hydrogen active organofunctional silanes include, e.g., aminosilanes (e.g., secondary amino-alkoxysilanes and mercaptoalkoxysilanes. Examples of suitable aminosilanes include phenyl amino propyl trimethoxy silane, methyl amino propyl trimethoxy silane, n-butyl amino propyl trimethoxy silane, t-butyl amino propyl trimethoxy silane, cyclohexyl amino propyl trimethoxy silane, dibutyl maleate amino propyl trimethoxy silane, dibutyl maleate substituted 4-amino 3,3-dimethyl butyl trimethoxy silane, amino propyl triethoxy silane and mixtures thereof, specific examples of which include N-methyl-3-amino-2-methylpropyltrimethoxysilane, N-ethyl-3-amino-2-methylpropyltrimethoxysilane, N-ethyl-3-amino-2-methylpropyldiethoxysilane, N-ethyl-3-amino-2-methylpropyltriethoxysilane, N-ethyl-3-amino-2-methylpropylmethyldimethoxysilane, N-butyl-3-amino-2-methylpropyltrimethoxysilane, 3-(N-methyl-3-amino-1-methyl-1-ethoxy) propyltrimethoxysilane, N-ethyl-4-amino-3,3-dimethylbutyldimethoxymethylsilane, N-ethyl-4-amino-3,3-dimethylbutyltrimethoxysilane, bis-(3-trimethoxysilyl-2-methylpropyl)amine, N-(3'-trimethoxysilylpropyl)-3-amino-2-methylpropyltrimethoxysilane, N,N-bis[(3-triethoxysilyl) propyl]amine, N,N-bis[(3-tripropoxy-silyl)propyl]amine, N-(3-trimethoxysilyl) propyl-3-[N-(3-trimethoxysilyl)-propylamino]propionamide, N-(3-triethoxysilyl) propyl-3-[N-3-triethoxysilyl)-propyl-amino]propionamide, N-(3-trimethoxysilyl) propyl-3-[N-3-triethoxysilyl)-propylamino]propionamide, 3-trimethoxysilylpropyl 3-[N-(3-trimethoxysilyl)-propylamino]-2-methyl propionate, 3-triethoxysilylpropyl 3-[N-(3-triethoxysilyl)-propylamino]-2-methyl propionate, 3-trimethoxysilylpropyl 3-[N-(3-triethoxysilyl)-propylamino]-2-methyl propionate, gamma-mercaptopropyl-trimethoxysilane and N,N'-bis((3-trimethoxysilyl)propyl) amine.

Useful commercially available aminosilanes include, e.g., aminosilanes available under the SILQUEST series of trade designations including, e.g., SILQUEST A-1170, SILQUEST A-1110, SILQUEST Y-9669 and SILQUEST A-15 from Momentive, under the DYNASYLAN series of trade designations including, e.g., DYNASYLAN 1189 N-(n-butyl)aminopropyltrimethoxysilane and DYNASYLAN MTMO 3-mercaptopropyl trimethoxy silane both of which are available from Degussa Corporation (Naperville, Ill.), and under the A-189 gamma-mercaptopropyltrimethoxysilane trade designation from Momentive.

Useful methods of preparing silanated-terminated polyurethane prepolymers are described, e.g., in U.S. Pat. Nos. 3,632,557, 4,345,053, 4,645,816 and 4,960,844, and incorporated herein.

One example of a useful method of preparing silanated-terminated polyurethane prepolymers having pendant or terminal silane functional groups includes the reaction of an isocyanato organofunctional silane with polyhydroxy functional polyurethane prepolymer, or the acrylate functional, hydroxy functional polyurethane prepolymer. Polyhydroxy functional polyurethane prepolymers can be prepared as described above with respect to the polyisocyanate functional polyurethane prepolymers, with the exception that the reaction mixture has a stoichiometric excess of polyol relative to the diisocyanate component so as to form a hydroxyl-functional polyurethane prepolymer. Preferably the ratio of hydroxy groups to isocyanate groups in the reaction mixture is from about 1.1:1 to about 4:1, more preferably from about 1.2:1 to about 2.5:1.

The hydroxyfunctional polyurethane prepolymer is then reacted with one or more isocyanated silanes, e.g., isocyanated silanes having the formula OCN—R—Si(X)m(-OR$^1$) 3-m wherein m is 0, 1 or 2, each R$^1$ is alkyl containing from 1 to 4 carbon atoms, preferably methyl or ethyl, each X is alkyl containing from 1 to 4 carbon atoms, preferably methyl or ethyl, and R is a difunctional organic group, preferably straight or branched difunctional alkyl containing from 2 to 6 carbon atoms such that the hydroxyl groups of the prepolymer are capped with isocyanate silane. Silane cappers suitable for the capping of the active hydrogen terminal or pendant atoms bearing urethane prepolymers are represented by the general formula OCN—R—Si(X)m(-OR$^1$) 3-m wherein R, R$^1$, X and in are as defined above. A number of useful structures for such isocyanato alkoxysilane compounds are disclosed in, e.g., U.S. Pat. No. 4,146,585 (columns 4 and 5), and incorporated herein. Preferred isocyanato alkoxysilanes include, e.g., gamma-isocyanatopropyl-triethoxysilane and gamma-isocyanatopropyl-trimethoxysilane, commercially available examples of which are available under the trade designation SILQUEST A-35 and SILQUEST A-25 from Momentive.

Silane Functional Poly-α-olefin Polymer.

The atmospheric curing or moisture curing prepolymer can also be a moisture curable silane functional poly-α-olefin polymer. Particularly useful silane functional poly-α-olefin polymers are either completely amorphous or have a low level of crystallinity. The degree of crystallinity preferably is no greater than 25% as determined by X-ray diffraction. Useful silane functional amorphous poly-α-olefin polymers are derived by grafting amorphous poly-α-olefin and a silane source. Suitable amorphous poly-α-olefins include, e.g., homopolymers, copolymers and terpolymers including, e.g., atactic polypropylene, atactic poly-1-butene and combinations thereof. The amorphous poly-α-olefins can be random or block copolymers. Other suitable amorphous poly-α-olefin polymers include, e.g., homogeneous substantially linear ethylene-α-olefin interpolymers of monomers including, e.g., propylene, 1-butene, 1-pentene, 3-methyl-1-butene, 1-hexene, 3-methyl-1-pentene, 4-methyl-1-pentene, 3-ethyl-1-pentene, 1-octene, 1-decene, and 1-undecene; amorphous copolymers with either olefins (e.g., ethylene, 1-butene, 1-pentene, 1-hexene, 4-methyl-1-pentene, 1-octene, and 1-decone) containing propylene as a main component, amorphous copolymers with other olefins (e.g., ethylene, propylene, 1-pentene, 1-hexene, 4-methyl-1-pentene, 1-octene, 1-decene and the like) containing 1-butene as a main component; and combinations thereof. Preferred olefin-based amorphous polymers include atactic polypropylene, propylene/ethylene amorphous copolymers, and propylene/1-butene amorphous copolymers.

One example of a useful class of amorphous poly-α-olefins include copolymers and terpolymers derived from 0% by weight to 95% by weight α-olefins having from 4 to 10 carbon atoms, (in other embodiments from 3% by weight to 95% by weight), from 5% by weight to 100% by weight propane (in other embodiments from 5% by weight to 97% by weight), and from 0% by weight to 20% by weight ethane as described, e.g., in U.S. Pat. No. 5,994,474 and incorporated herein.

The silane to be grafted on the amorphous poly-α-olefin can have two or three alkoxy groups attached directly to the silicon and at least one olefinic double bond containing moiety. Suitable examples include vinyltrimethoxysilane, vinyltriethoxysilane, vinyl tris(2-methoxyethoxy)silane, 3-methacryloxypropyltrimethoxysilane, 3-methacryloxypropyltriethoxysilane, vinyldimethylmethoxysilane and vinylmethyldibutoxysilane.

The amount of silane for grafting on the amorphous poly-α-olefin is about 0.1% by weight to about 10% by weight, from about 2% by weight to about 6% by weight, or even from about 3% by weight to about 5% by weight, based on the amorphous poly-α-olefin.

Any known method for grafting silane onto the amorphous poly-α-olefin can be used including, e.g., solution and melt (e.g., using an appropriate amount of a free-radical donor) methods. Useful methods of preparing silylated amorphous poly-α-olefin are described, e.g., in U.S. Pat. No. 5,994,474 and DE 40 00 695 and incorporated herein. Suitable examples of free-radical donors include diacyl peroxides such as dilauryl peroxide and didecanoyl peroxide, alkyl peresters such as tert-butyl peroxy-2-ethylhexanoate, perketals such as 1,1-di(tert-butylperoxy)-3,3,5-trimethylcyclohexane or 1,1-di(tert-butyleperoxy)cyclohexane, dialkyl peroxides such as tert-butyl cumyl peroxide, di(tert-butyl) peroxide and dicumyl peroxide, C-radical donors including, e.g., 3,4-dimethyl-3,4-diphenylhexane and 2,3-dimethyl-2,3-diphenylbutane, and azo compounds (e.g., 2,2'-azodi(2-acetoxypropane)).

Preferably the amorphous poly-α-olefin has a number average molecular weight (Mn) from about 7,000 to about 14,000, a weight average molecular weight (Mw) from about 35,000 to about 90,000 and a Z average molecular weight (Mz) from about 13,000 to about 33,000, and polydispersity (MWD) from about 4.9 to about 6.2.

Preferred silane functional amorphous poly-α-olefin polymers include those that are commercially available under the VESTOPLAST trade designation from Evonik, Germany including, e.g., VESTOPLAST 206V silane functional amorphous poly-α-olefins.

In some embodiments, the silane functional poly-α-olefin polymer has a Mettler softening point of less than 120° C. In one embodiment, the silane functional poly-α-olefin polymer has a Mettler softening point of at least 120° C. The silane functional poly-α-olefin polymer is present in the composition in an amount of from about 5% by weight to about 100% by weight, or to about 80% by weight, from about 15% by weight to about 50% by weight, or even from about 25% by weight to about 40% by weight, based on the weight of the composition.

Thermoplastic Component Having a Mettler Softening Point of at Least 120° C.

The adhesive composition may further include a thermoplastic component having a Mettler softening point of at least about 120° C. The thermoplastic component can be a thermoplastic polymer or a thermoplastic elastomer, or a combination thereof. In one embodiment, the thermoplastic component is reactive, e.g., reacting with an isocyanate group into the atmospheric curing prepolymer. In one embodiment, the thermoplastic component is non-reactive.

Thermoplastic Elastomers.

Exemplary thermoplastic elastomers having a Mettler softening point of at least 120° C. include polyetheramide block copolymers, polyesters, butadiene-styrene elastomers including, e.g., A-B, A-B-A, A-(B-A)n-B, (A-B)n-Y, and radial block copolymers and grafted versions thereof where the A block(s) is a polyvinyl aromatic block (e.g., styrene), and the B block is a rubbery midblock (e.g., isoprene, butadiene, ethylene-butylene, and ethylene-propylene) (e.g., styrene-butadiene-styrene block copolymers, styrene-isoprene-styrene block copolymers, styrene-ethylene-butylene-styrene block copolymers, styrene-ethylene-propylene-styrene block copolymers), polyurethane elastomers, polyolefin elastomers, elastomeric ethylene vinyl acetate, ethylene-octene block copolymers, and mixtures thereof.

Useful commercially available thermoplastic elastomers having a softening point of at least 120° C. include, e.g., thermoplastic elastomers available under the HYTREL 3078, HYTREL 4053, and HYTREL 4056 trade designations from E.I. DuPont de Nemours (Delaware), styrene-ethylene/butylene-styrene block copolymers available under the KRATON G series of trade designations including, e.g., KRATON G-1652 and G-1657, from Kraton Polymers (Houston, Tex.); styrene-butadiene-styrene and styrene-isoprene-styrene block copolymers available under the KRATON D series of trade designations including, e.g., KRATON D-1111 and D-1112 from Kraton Polymers; silane terminated block copolymer available under the KRATON SKFG101 trade designation from Kraton Polymers; and styrene-butadiene-styrene and styrene-isoprene-styrene block copolymers available under the VECTOR series of trade designations including, e.g., VECTOR 4112, 4114, and 4411 from Dexco Polymers (Houston, Tex.); ethylene-octene block copolymers available under the INSITE trade designation including, e.g., INSITE D9807.15 from Dow Chemical Company.

When present in the adhesive, the thermoplastic elastomer having a Mettler softening point of at least 120° C. is in an amount of up to about 75% by weight, or from about 5% by weight, or from about 10% by weight, or from about 20% by weight to about 75% by weight, or to about 60% by weight, or to about 40% by weight, based on the weight of the adhesive composition.

Thermoplastic Polymers.

The thermoplastic polymers having a Mettler softening point of at least 120° C. can be selected from a variety of classes of thermoplastic polymers including, e.g., polyalkylenes (e.g., polyethylene, polypropylene and polybutylene), poly(alpha)olefins including, e.g., homo-, co-, and terpolymers of aliphatic mono-1-olefins (alpha olefins) (e.g., poly(alpha)olefins containing from 2 to 10 carbon atoms), homogenous linear or substantially linear interpolymers of ethylene having at least one $C_3$ to $C_{20}$ alpha olefin, polyisobutylenes, poly(alkylene oxides), poly(phenylenediamine terephthalamide), polyesters (e.g., polyethylene terephthalate), polyacrylates, polymethacrylates, polyacrylamides, polyacrylonitriles, copolymers of acrylonitrile and monomers including, e.g., butadiene, styrene, polymethyl pentene, and polyphenylene sulfide (e.g., styrene-acrylonitrile, acrylonitrile-butadiene-styrene, acrylonitrile-styrene-butadiene rubbers), polyimides, polyamides, copolymers of vinyl alcohol and ethylenically unsaturated monomers, polyvinyl acetate (e.g., ethylene vinyl acetate), polyvinyl alcohol, vinyl chloride homopolymers and copolymers (e.g., polyvinyl chloride), terpolymers of ethylene, carbon monoxide, and acrylic acid ester or vinyl monomer, polysiloxanes, polyurethanes, polystyrene, and combinations thereof, and homopolymers, copolymers, and terpolymers thereof, and mixtures thereof. Other useful classes of thermoplastic polymers include asphalts, bitumens, crude rubbers, fluorinated rubbers, and cellulosic resins.

Other useful thermoplastic polymers include thermoplastic resins having a Mettler softening point of at least 120° C., e.g., tackifying resins having a Mettler softening point of at least 120° C.

Useful commercially available thermoplastic polymers having a Mettler softening point of at least 120° C. include, e.g., amorphous polyalphaolefins available from Evonik under the trade designations VESTOPLAST 308, VESTOPLAST 608, and VESTOPLAST 703, atactic polypropylene polymers available under the REXTAC series of trade designations including, e.g., REXTAC RT 2535 and RT 2585, from REXTAC LLC (Odessa, Tex.) and the EASTOFLEX series of trade designations including, e.g., EASTOFLEX E1060 from Eastman Chemical Co. (Kingsport, Tenn.); polyethylene polymers available under the EPOLENE C-17 trade designation from Westlake Chemical Corporation; ethylene methyl acrylate copolymers available under the OPTEMA series of trade designations from ExxonMobil Chemical Co. (Houston, Tex.); butylene/poly(alkylene ether) phthalate polymers available under the HYTREL trade designations from DuPont; alphamethyl styrene resin KRISTALEX 5140 and 1120 from Eastman, petroleum hydrocarbon resins ESCOREZ 5415, 5615, 5632 from Exxon, aromatic hydrogenated hydrocarbon resin REGALREZ 1126 from Eastman.

When present in the adhesive, the thermoplastic polymer having a Mettler softening point of at least 120° C. is preferably in an amount of up to about 75% by weight, or from about 5% by weight, from about 10% by weight, or from about 20% by weight to about 75% by weight, to about 60% by weight, or to about 40% by weight, based on the weight of the adhesive composition.

Thermoplastic Polymer with a Mettler Softening Point of Less than 120° C.

The adhesive composition optionally includes a thermoplastic polymer having a Mettler softening point of less than 120° C. Classes of such suitable thermoplastic polymers include, e.g., thermoplastic polyurethanes, thermoplastic polyester block copolymers, thermoplastic polyetheramides, low molecular weight polymers of ethylenically unsaturated monomers (e.g., (co)polymers of at least one of the following monomers: $C_1$-$C_{18}$ alkyl esters of acrylic acid and methacrylic acid (e.g., ethylene acrylate, ethylene methacrylate, ethylene butylacrylate, ethylene hydroxyethyl acrylate, and combinations thereof), acrylic acid, methacrylic acid, vinyl versatate, and vinyl ethers), vinyl polymers (e.g., ethylene vinyl acetate copolymers, and vinyl propionate), alkyl fumarates, alkyl maleates, styrene, alkylstyrene, acrylonitrile, butadiene, isoprene, hydrogenation products of butadiene and isoprene copolymers, such as styrene-ethylene-propylene and styrene-ethylene-butylene diblock and triblock copolymers. The thermoplastic polymer preferably has a number average molecular weight less than about 60,000, or even from about 10,000 to about 40,000. One useful example of the optional thermoplastic polymers includes a vinyl acetate-ethylene copolymer that includes from about 18% by weight to about 80% by weight vinyl acetate.

Thermoplastic polymers with a Mettler softening point of lower than 120° C. including e.g., ethylenevinyl acetate, ethylene-acrylic acid, ethylenemethacrylate and ethylene-n-butyl acrylate copolymers, polyvinyl alcohol, hydroxyethylcellulose, hydroxylpropylcellulose, polyvinyl methyl ether, polyethylene oxide, polyvinylpyrrolidone, polyethyloxazolines, starch, cellulose esters, and combinations thereof.

Other thermoplastic polymers with a Mettler soften point of lower than 120° C. include tackifying resins having a Mettler softening point of from about 70° C. to less than 120° C., preferably from about 80° C. to about 100° C.

Examples of suitable tackifying resins include aliphatic, cycloaliphatic, aromatic, aliphatic-aromatic, aromatic modified alicyclic, and alicyclic hydrocarbon resins and modified versions and hydrogenated derivatives thereof; terpenes (polyterpenes), modified terpenes (e.g., phenolic modified terpene resins), hydrogenated derivatives thereof and mixtures thereof; natural and modified rosins such as gum rosin, wood rosin, tall oil rosin, distilled rosin, hydrogenated rosin, dimerized rosin and polymerized rosin; rosin esters including, e.g., glycerol and pentaerythritol esters of natural and modified rosins (e.g., glycerol esters of pale, wood rosin, glycerol esters of hydrogenated rosin, glycerol esters of polymerized rosin, pentaerythritol esters of hydrogenated rosin and phenolic-modified pentaerythritol esters of rosin); alpha methyl styrene resins and hydrogenated derivatives thereof; low molecular weight polylactic acid; and combinations thereof. Other useful tackifying resins are disclosed in, e.g., U.S. Pat. No. 6,355,317, and incorporated herein.

Suitable commercially available tackifying resins include, e.g., partially hydrogenated cycloaliphatic petroleum hydrocarbon resins available under the EASTOTAC series of trade designations including, e.g., EASTOTAC H-100, H-115, H-130 and H-142 from Eastman Chemical Co. (Kingsport, Tenn.) available in grades E, R, L and W, which have differing levels of hydrogenation from least hydrogenated (E) to most hydrogenated (W), the ESCOREZ series of trade designations including, e.g., ESCOREZ 5300 and ESCOREZ 5400 from Exxon Chemical Co. (Houston, Tex.), and the HERCOLITE 2100 trade designation from Hercules (Wilmington, Del.); partially hydrogenated aromatic modified petroleum hydrocarbon resins available under the ESCOREZ 5600 trade designation from Exxon Chemical Co.; aliphatic-aromatic petroleum hydrocarbon resins available under the WINGTACK EXTRA trade designation from; styrenated terpene resins made from d-limonene available under the ZONATAC 105 LITE trade designation from Arizona Chemical Co. (Panama City, Fla.); aromatic hydrogenated hydrocarbon resins available under the REGALREZ 1094 trade designation from Hercules; and alphamethyl styrene resins available under the trade designations KRISTALEX 3070, 3085 and 3100, which have softening points of 70° C., 85° C., and 100° C., respectively, from Hercules.

The thermoplastic polymer having a Mettler softening point of lower than 120° C. may be present in the adhesive composition in an amount of from 0% by weight to about 20% by weight, or even from about 0% by weight to about 10% by weight, based on the weight of the adhesive composition.

Other Additives

The adhesive can optionally include other additives including, for example, antioxidants, plasticizers, tackifying agents, adhesion promoters, non-reactive resins, ultraviolet light stabilizers, catalysts, rheology modifiers, biocides, corrosion inhibitors, dehydrators, organic solvents, colorants (e.g., pigments and dyes), fillers, surfactants, flame retardants, waxes, and mixtures thereof.

The adhesive can optionally include a silane adhesion promoter. Exemplary silane adhesion promoters have a flash point greater than 100° C. at atmospheric pressure and a boiling point great than 100° C. at from 0.5 mmHg to 15 mmHg. Silane adhesion promoters are compounds or monomers that have an average molecular weight of from about 300 to about 1000, or from about 300 to about 800, or from about 500 to about 700. Useful silane adhesion promoters include silyl groups such as alkoxysilyls, acryloxysilyls, alkyloxyminosilyls, oxime silyls, amino silyls, and combinations thereof. Examples of useful alkoxysilyl groups include methoxysilyl, ethoxysilyl, propoxysilyl, butoxysilyl, and acyloxysilyl reactive groups including, e.g., silyl ester of various acids including, e.g., acetic acid, 2-ethylhexanoic acid, palmitic acid, stearic acid, and oleic acid.

Suitable silane adhesion promoters include, e.g., methacryloxy propyl triethoxy-silane, M-aminophenyltriethoxy-silane, P-aminophenyltriethoxy-silane, N-(2-aminoethyl)-3-aminopropyl triethoxy-silane, n-butylaminopropyltrimethoxy-silane, bis(triethoxysilylpropyl)amine, bis(trimethoxysilylpropyl)amine, 3-(trimethoxysilyl) propyl succinic anhydride, (3-glycidoxypropyl)methyldiethoxy-silane, (3-glycidoxypropyl)methyldimethoxy-silane, tris(3-trimethoxysilylpropyl)isocyanurate, bis (triethoxysilyl)ethane, bis(trimethoxysilyl)benzene, and combinations thereof.

Suitable silane adhesion promoters are commercially available under the SILQUEST A-1170 and SILQUEST SILQUEST A-LINK 597 trade designations from Momentive Performance Materials, Inc. (Albany, N.Y.).

The silane adhesion promoter, when present, is preferably in an amount of from about 0.01% by weight to about 5% by weight, from about 0.01% by weight to about 2% by weight, or even from about 0.01% by weight to about 1% by weight, based on the weight of the composition.

The adhesive can optionally include a plasticizer. Suitable plasticizers include, e.g., phthalates, benzoates, sulfonamides, and mixtures thereof, and epoxidized soybean oil. Useful sources of dioctyl and diisodecyl phthalate include those available under the trade designations JAYFLEX DOP and JAYFLEX DIDP from Exxon Chemical. Useful dibenzoates are available under the trade designations BENZOFLEX 9-88, BENZOFLEX 50 and BENZOFLEX 400 from Eastman Chemical Co. Soybean oil is commercially available, e.g., from Dow Chemical under the trade designation FLEXOL EPO.

Plasticizer may be present in an amount of from about 0.25% by weight to about 10% by weight, no greater than about 5% by weight, no greater than about 3% by weight, or even from about 0.5% by weight to 2% by weight.

The adhesive can optionally include a catalyst. Suitable catalysts facilitate the reaction between the polyol and polyisocyanate, hydrolysis, and/or the subsequent crosslinking reaction of the silane groups, isocyanate groups, or a combination thereof. Useful catalysts include, e.g., tertiary amines including, e.g., N,N-dimethylaminoethanol, N,N-dimethyl-cyclohexamine-bis(2-dimethyl aminoethyl)ether, N-ethylmorpholine, N,N,N',N',N''-pentamethyl-diethylenetriamine, and 1-2(hydroxypropyl) imidazole, and metal catalysts including, e.g., tin (e.g., dialkyl tin dicarboxylates, e.g., dibutyl tin dilaurate and dibutyl tin diacetate, stannous salts of carboxylic acids, e.g., stannous octoate and stannous acetate, tetrabutyl dioleatodistannoxane), titanium compounds, bismuth carboxylates, organosilicon titantates, alkyltitantates, and combinations thereof.

The adhesive can optionally include a filler. Suitable fillers include, e.g., fumed silica, precipitated silica, talc, calcium carbonates, carbon black, alumina silicates, clay, zeolites, ceramics, mica, titanium dioxide, and combinations thereof. When present, the adhesive preferably includes filler in an amount of at least 0.5% by weight, from about 1% by weight to about 50% by weight, or even from about 1% by weight to about 10% by weight.

Methods of Making and Using

The disclosed adhesives can be used throughout the electronics manufacturing process. In some embodiments, the adhesive is used to bond multiple layers of an electronic assembly together. An exemplary multi-layered assembly is shown in FIG. 1. FIG. 1 shows a general assembly 10. The assembly 10 includes a first substrate 12 and a second substrate 14. The assembly 10 includes at least one electronic component 20 located between substrate 12 and substrate 14. It is understood that the assembly 10 can include more than one electronic component 20 as shown in FIG. 1.

The assembly 10 can optionally include a conductive layer 16 and 18 located between the electronic component 20 and the substrates 12 and 14. The conductive layer can be a conductive coating, a conductive ink, or a conductive adhesive. The conductive layer can be continuous along the substrate as shown in FIG. 1, or discontinuous. An exemplary conductive layer is indium-tin-oxide (ITO). The electronic component 20 may be placed between the first substrate 12 and second substrate 14 in such a way as to be in direct or indirect electrical communication with the conductive layers 16 and 18. Direct communication can be intimate contact and indirect communication can be through a conductive material or medium. In may be desirable for one side of the electronic component to correspond to an anode side and the other side to correspond to a cathode side.

The adhesive can be used to bond and/or seal the layers of the assembly 10 together either by applying adhesive 24 to the edges of the assembly, as shown in FIG. 2, or by flooding the assembly with adhesive 24 as shown in FIG. 3.

The disclosed adhesive compositions can be used to manufacture electronic assemblies. When used with electronics, the adhesive composition can also function as a conductive adhesive, semi-conductive adhesive, insulative adhesive, or sealant. The assembly can include a variety of electronics components. Exemplary electronics components include light emitting diodes (LEDs), organic LEDs, high brightness LEDs, radiation frequency identification (RFID) tags, electrochromatic displays, electrophoretic displays, batteries, sensors, solar cells, and photovoltaic cells.

Using adhesives to adhere substrates together or seal electronic component(s) between two substrates can provide benefits like protection from elements such as moisture, UV radiation, oxygen, and the like. It can also provide protection from off-gasses from the materials in the assembly. It can also allow electrons to travel between the two substrates.

In some embodiments, the disclosed adhesives can be used to laminate various electronic components in between two flexible substrates. Exemplary lamination processes include roll-to-roll manufacturing processes. The adhesive can be applied to the substrate in a variety of ways. For example, the adhesive can be applied in a liquid state. The adhesive may be applied using any suitable coating process including, e.g., air knife, trailing blade, spraying, brushing, dipping, doctor blade, roll coating, gravure coating, offset gravure coating, rotogravure coating, linear extruder, hand gun, extruder beads, and combinations thereof. The adhesive can also be printed on in a predetermined pattern. The adhesive can also be applied to a release liner where the adhesive/liner composite is adhered to a substrate.

The adhesive is preferably applied in the form of a melt at temperatures from about 50° C. to about 150° C., about 65° C. to about 130° C., or from about 75° C. to about 115° C. The coating weight of the adhesive may vary broadly depending on the properties desired of the laminate. Useful adhesive coating weights include from 1 mil to 50 mils. Prior to applying the adhesive, either of a first substrate and a second substrate has at least one electronic component thereon. Once coated with the adhesive, the first substrate is contacted with a second substrate. The second substrate may be of the same or different material relative to that of the first substrate. The bonding process may be repeated a number of times, so that it is possible to produce articles which consist of more than two bonded layers. The adhesive is allowed to cure through exposure to moisture.

In some embodiments, the disclosed adhesives can be used to seal electronic components to provide further protection. In such applications the adhesive can be applied to the edges of the substrates only, or can be applied to the entire surface of the substrate, encapsulating the electronic component. The adhesive can be applied using any of the processes described above.

In some embodiments, the disclosed adhesives can be used to bond components together as part of a manufacturing process. This application is similar to the laminating process in that two substrates are being bonded together. But, this process may be used with rigid and flexible substrates.

Substrates

The disclosed adhesive composition can be used with a variety of rigid or flexible substrates. Exemplary substrates include flexible films such as metal foils (aluminum foil), polymer films and metallized polymer films prepared from polymers including, e.g., polyolefins (e.g., polypropylene, polyethylene, low density polyethylene, linear low density polyethylene, high density polyethylene, polypropylene, and oriented polypropylene; copolymers of polyolefins and other comonomers) metalized polyolefins (e.g., metalized polypropylene), metalized polyether terephthalate, ethylene-vinyl acetates, ethylene-methacrylic acid ionomers, ethylene-vinyl-alcohols, polyesters, e.g. polyethylene terephthalate, polycarbonates, polyamides, e.g. Nylon-6 and Nylon-6,6, polyvinyl chloride, polyvinylidene chloride, polylactic acid, cellulosics, and polystyrene, cellophane, and paper. The thickness of a film may vary, but flexible films typically have a thickness of less than about 0.25 millimeters, e.g. from about 10 micrometers to about 150 micrometers, more typically from about 8 micrometers to about 100 micrometers. The surface of the substrate can be surface treated to enhance adhesion using any suitable method including, e.g., corona treatments, chemical treatments and flame treatments.

Other suitable substrates include, e.g. woven webs, non-woven webs, paper, paperboard, and cellular flexible sheet materials (e.g., polyethylene foam, polyurethane foam and sponge and foam rubber). Woven and non-woven webs can include fibers including, e.g., cotton, polyester, polyolefin, polyamide, and polyimide fibers.

Other substrates can include glass, transparent plastics such as polyolefins, polyethersulfones, polycarbonates, polyester, polyarylates, and polymeric films.

The above specification, examples and data describe the disclosure. Additional embodiments can be made without departing from the spirit and scope of the disclosure. All parts, ratios, percents, and amounts stated in the examples are by weight unless otherwise specified.

EXAMPLES

Test Methods

Lap Shear Strength

Lap shear strength is determined according to ASTM D3163 in which the test specimen is constructed to have 5 mil coating of adhesive on a first 10 mil thick polyethylene terephthalate (PET) substrate laminated to a second 10 mil thick polyethylene terephthalate (PET) substrate with a 1 inch×1 inch substrate overlap.

The Maximum Load is determined and results are reported as lap shear strength in units of $lbs/in^2$ (psi). Reporting an average of three samples.

Moisture Vapor Transmission Rate (MVTR)

Moisture vapor transmission rate (MVTR) is determined according to ASTM F1249-90 entitled, "Standard Test Method for Water Vapor Transmission Rate Through Plastic Film and Sheeting using a Modulated Infrared Sensor." The test is conducted at approximately 37° C. (100° F.) and 90% relative humidity on a sample in the form of a film having a specified thickness.

Peel Adhesion Test Method

T-Peel strength is determined according to ASTM D1876-01 entitled, "Standard Test Method for Peel Resistance of Adhesives," which is incorporated herein. The test specimen is constructed to have 5 mil coating of adhesive on a first 10 mil thick polyethylene terephthalate (PET) substrate laminated to a second 10 mil thick polyethylene terephthalate (PET) substrate with a 1 inch×1 inch substrate overlap.

The peel speed is 12 inches per minute. The results are reported in lbs per lineal inch. Reporting an average of three samples.

Mettler Softening Point

Mettler softening point is determined according to ASTM D6493-11 entitled, "Standard Test Methods for Softening Point of Hydrocarbon Resins and Rosin Based Resins by Automated Ring-and-Ball Apparatus."

Examples 1-4

Each laminate of Examples 1-4 was prepared according to herein described Lap Shear Strength and Peel Adhesive test methods and by heating a reactive hot melt adhesive according to Table 1, which is commercially available from H.B. Fuller Company (St. Paul, Minn.), to an applicable application temperature, applying the melt adhesive to a first PET film substrate, immediately laminating the first PET film with a second PET film substrate to form a laminate, and rolling with a one kilogram weight to ensure full contact. The laminate was then tested according to herein described Lap Shear Strength test method and Peel Strength test method. The results are also listed in Table 1.

TABLE 1

| Adhesive | Test interval | Example 1 TL5207 | Example 2 HL9647 | Example 3 EH9630 | Example 4 EH9640LT |
|---|---|---|---|---|---|
| T-Peel Strength | Immediately after bonding | 1.45 | 2.79 | 2.34 | 3.55 |
| | After 15 min. | 1.40 | 3.18 | 3.65 | 2.38 |
| | After 30 min. | 1.87 | 2.95 | 3.50 | 3.25 |
| | After 60 min. | 1.34 | 2.91 | 2.08 | 1.05 |
| | After 24 hrs. | 1.59 | 3.62 | 3.21 | 8.09 |
| | After 7 days | 1.44 | 4.50 | 3.03 | SF* |
| Lap Shear Strength | Immediately after bonding | 13.60 | 60.30 | 25.93 | 60.00 |
| | After 15 min. | 40.67 | 60.10 | 62.73 | 82.60 |
| | After 30 min. | 80.20 | 57.17 | 64.27 | 82.60 |
| | After 60 min. | 96.60 | 70.07 | 71.63 | 135.70 |
| | After 24 hrs. | 106.07 | 67.70 | 78.90 | SF |
| | After 7 days | 118.80 | 89.23 | 81.53 | SF |

TL5207—a reactive hot melt adhesive including an aliphatic isocyanate-terminated polyurethane prepolymer without a thermoplastic component;
HL9647—a reactive hot melt adhesive including a slime functional poly-a-olefin polymer, a thermoplastic polymer having Mettler softening point (SP) of 138° C. and a thermoplastic resin having a Mettler SP of 115° C.;
EH9630—a reactive hot melt adhesive including a silanated-terminated poly-a-olefin, a thermoplastic elastomer with a Mettler SP of greater than 120° C., a thermoplastic polymer with a Mettler SP of 107° C., and a thermoplastic resin with a Mettler SP of 94° C.;
EH9640LT—a reactive hot melt adhesive including an aromatic isocyanate-terminated polyurethane prepolymer, a thermoplastic elastomer with a Mettler SP of >120° C., a thermoplastic polymer with a Mettler SP of <120° C., and a thermoplastic resin with a Mettler SP of 100° C.
*SF: substrate failure.

The above specification, examples and data describe the disclosure. Additional embodiments can be made without departing from the spirit and scope of the disclosure.

We claim:

1. A method of making an electronic assembly comprising:
applying a reactive hot melt adhesive composition comprising an atmospheric curing prepolymer and a first thermoplastic component, the first thermoplastic component having a Mettler softening point of less than 120° C. to at least a portion of a first substrate, the atmospheric curing prepolymer being an aliphatic isocyanate terminated polyurethane prepolymer that is a reaction product of an aliphatic polyisocyanate and a polyol at an NCO/OH ratio of from about 4.0:1.0 to about 4.0:1.5, and
contacting the adhesive on the first substrate with at least a portion of a second substrate, at least one of the first and second substrates comprising at least one electronic component prior to applying the adhesive composition, the electronic component being disposed between the first substrate and the second substrate
the first and second substrates being of the same or different material and being independently selected from the group consisting of polyethylene, polyethylene terephthalate, polyethylene naphthalate, and mixtures thereof.

2. The method of claim 1, wherein the adhesive is moisture curable.

3. The method of claim 1, wherein the adhesive is a solid at room temperature and has a Mettler softening point of 150° C. or below.

4. The method of claim 1, wherein the adhesive is a one-component adhesive.

5. The method of claim 1, wherein the electronic component is selected from the group consisting of a light emitting diode (LED), an organic LED, a high brightness LED, a radiation frequency identification (RFID) tag, an electrochromic display, an electrophoretic display, a battery, a sensor, a solar cell, and a photovoltaic cell.

6. The method of claim 1, wherein the adhesive further comprises a second thermoplastic component, the second thermoplastic component having a Mettler softening point of at least 120° C.

7. The method of claim 6, wherein the electronic component is selected from the group consisting of a light emitting diode (LED), an organic LED, a high brightness LED, a radiation frequency identification (RFID) tag, an electrochromic display, an electrophoretic display, a battery, a sensor, a solar cell, and a photovoltaic cell.

8. The method of claim 6, wherein the reactive hot melt adhesive composition comprises from 10% by weight to about 75% by weight of the second thermoplastic component having a Mettler softening point of at least 120° C.

9. The method of claim 6, wherein the first thermoplastic component having a Mettler softening point of less than 120° C. is a tackifying resin having a Mettler softening point from about 80° C. to about 100° C.

10. An electronic assembly comprising:
a first substrate;
a second substrate;
at least one electronic component located between the first and the second substrates; and
a reactive hot melt adhesive comprising
a reaction product of an atmospheric curing prepolymer and moisture, the atmospheric curing prepolymer being an aliphatic isocyanate terminated polyurethane prepolymer that is a reaction product of an aliphatic polyisocyanate and a polyol at an NCO/OH ratio of from about 4.0:1.0 to about 4.0:1.5, and
a first thermoplastic component having a Mettler softening point of less than 120° C.,
wherein at least a portion of the first substrate is bonded to at least a portion of the second substrate by the adhesive,
the first and second substrates being of the same or different material and being independently selected from the group consisting of polyethylene, polyethylene terephthalate, polyethylene naphthalate, and mixtures thereof.

11. The assembly of claim 10, wherein the electronic component is selected from the group consisting of a light emitting diode (LED), an organic LED, a high brightness LED, a radiation frequency identification (RFID) tag, an electrochromic display, an electrophoretic display, a battery, a sensor, a solar cell, and a photovoltaic cell.

12. The assembly of claim 10, wherein the adhesive further comprises an additive selected from the group consisting of antioxidants, plasticizers, tackifying agents, adhesion promoters, non-reactive resins, ultraviolet light stabilizers, catalysts, rheology modifiers, biocides, corrosion inhibitors, dehydrators, organic solvents, colorants, fillers, surfactants, flame retardants, waxes, and mixtures thereof.

13. The assembly of claim 10, wherein the adhesive further comprises a second thermoplastic component, the second thermoplastic component having a Mettler softening point of at least 120° C.

14. The assembly of claim 13, wherein the electronic component is selected from the group consisting of a light emitting diode (LED), an organic LED, a high brightness LED, a radiation frequency identification (RFID) tag, an electrochromic display, an electrophoretic display, a battery, a sensor, a solar cell, and a photovoltaic cell.

15. The assembly of claim 13, wherein the hot melt adhesive composition comprises from 10% by weight to about 75% by weight of the second thermoplastic component having a Mettler softening point of at least 120° C.

16. The assembly of claim 13, wherein the first thermoplastic component having a Mettler softening point of less than 120° C. is a tackifying resin having a having a Mettler softening point from about 80° C. to about 100° C.

* * * * *